United States Patent
Bode et al.

(10) Patent No.: US 9,584,104 B2
(45) Date of Patent: Feb. 28, 2017

(54) SEMICONDUCTOR DEVICE AND METHOD OF OPERATING A SEMICONDUCTOR DEVICE

(71) Applicants: Hubert Bode, Haar (DE); Mathieu Gauthier Lesbats, Munich (DE); Andreas Johann Roth, Guenzenhausen (DE)

(72) Inventors: Hubert Bode, Haar (DE); Mathieu Gauthier Lesbats, Munich (DE); Andreas Johann Roth, Guenzenhausen (DE)

(73) Assignee: NXP USA, Inc., Austin, TX (US)

( * ) Notice: Subject to any disclaimer, the term of this patent is extended or adjusted under 35 U.S.C. 154(b) by 165 days.

(21) Appl. No.: 14/214,801

(22) Filed: Mar. 15, 2014

(65) Prior Publication Data
US 2015/0263713 A1 Sep. 17, 2015

(51) Int. Cl.
 *H03K 3/01* (2006.01)
 *H03K 5/1252* (2006.01)

(52) U.S. Cl.
 CPC .................................. *H03K 5/1252* (2013.01)

(58) Field of Classification Search
 CPC ................ G05F 3/00; G05F 3/02; G11C 5/00; G11C 5/14; G11C 5/145; G11C 5/146; G11C 5/147; H03K 2217/00; H03K 2217/0027; H03K 2217/0036
 USPC ........... 324/126; 327/534, 536; 361/56, 111; 257/355–360
 See application file for complete search history.

(56) References Cited

U.S. PATENT DOCUMENTS

| | | | |
|---|---|---|---|
| 4,042,944 A | 8/1977 | Yoshida et al. | |
| 4,044,373 A | 8/1977 | Nomiya et al. | |
| 4,085,432 A | 4/1978 | Varettoni | |
| 4,317,084 A * | 2/1982 | Senturia | H01L 29/42312 257/252 |
| 4,710,647 A | 12/1987 | Young | |
| 4,800,295 A * | 1/1989 | Minuhin | G11B 20/1426 327/176 |
| 5,121,001 A | 6/1992 | Dansky et al. | |
| 5,168,340 A | 12/1992 | Nishimura | |

(Continued)

OTHER PUBLICATIONS

Notice of Allowance mailed Oct. 3, 2014 for U.S. Appl. No. 14/232,479, 13 pages.

(Continued)

*Primary Examiner* — Lincoln Donovan
*Assistant Examiner* — Diana J Cheng

(57) ABSTRACT

A semiconductor device comprising a substrate and an electronic circuit thereon is described. The electronic circuit comprises a first voltage provider node, a second voltage provider node, and an intermediary node connected to the first and second voltage provider node by a first and second network with a first and second resistance, respectively. The substrate is susceptible to conducting a substrate current. The semiconductor device further comprises a substrate current sensor. The first network is arranged to reduce the first resistance in response to the substrate current sensor signaling an increase of the substrate current and vice versa. Similarly, the second network is arranged to reduce the second resistance in response to the substrate current sensor signaling an increase of the substrate current and vice versa. A method of operating a semiconductor device is also disclosed.

16 Claims, 7 Drawing Sheets

(56) References Cited

U.S. PATENT DOCUMENTS

| | | | |
|---|---|---|---|
| 5,949,259 A | 9/1999 | Garcia | |
| 5,968,083 A | 10/1999 | Ciciarelli et al. | |
| 6,005,413 A * | 12/1999 | Schmitt | H03K 19/00315 326/58 |
| 6,060,906 A | 5/2000 | Chow et al. | |
| 6,118,324 A | 9/2000 | Li et al. | |
| 6,130,556 A | 10/2000 | Schmitt et al. | |
| 6,181,156 B1 | 1/2001 | Durham et al. | |
| 6,184,703 B1 | 2/2001 | Vest et al. | |
| 6,225,819 B1 | 5/2001 | Rees et al. | |
| 6,313,664 B1 | 11/2001 | Hall et al. | |
| 6,657,459 B2 | 12/2003 | Nishio et al. | |
| 6,750,695 B2 | 6/2004 | Blodgett et al. | |
| 7,280,092 B2 | 10/2007 | Landolt | |
| 7,472,322 B1 | 12/2008 | Ma et al. | |
| 8,315,026 B2 * | 11/2012 | Roth | H03K 19/00346 361/111 |
| 2003/0072120 A1 | 4/2003 | Ishikawa et al. | |
| 2004/0178823 A1 | 9/2004 | Ananthanarayanan et al. | |
| 2006/0139051 A1 | 6/2006 | Gallo et al. | |
| 2007/0164789 A1 | 7/2007 | Panjwani et al. | |
| 2008/0069376 A1 | 3/2008 | Rashid et al. | |
| 2009/0230780 A1 | 9/2009 | Oyamada | |
| 2010/0244907 A1 | 9/2010 | Gagne et al. | |
| 2010/0315053 A1 | 12/2010 | Koh et al. | |
| 2014/0145760 A1 | 5/2014 | Nguyen et al. | |

OTHER PUBLICATIONS

U.S. Appl. No. 14/214,796, filed Mar. 15, 2014, entitled "Semiconductor Device".
U.S. Appl. No. 14/232,479, filed Jan. 13, 2014, entitled "Signalling Circuit, Processing Device and Safety Critical System".
Non-Final Office Action mailed Dec. 4, 2015 for U.S. Appl. No. 14/214,796, 16 pages.
U.S. Appl. No. 14/214,796, Bode, H. et al., "Semiconductor Device", Office Action—Final Rejection, mailed Jun. 29, 2016.

* cited by examiner

SEMICONDUCTOR DEVICE AND METHOD OF OPERATING A SEMICONDUCTOR DEVICE

FIELD OF THE INVENTION

This invention relates to a semiconductor device and to a method of operating a semiconductor device.

BACKGROUND OF THE INVENTION

FIG. 1 schematically shows an example of a semiconductor device 10, e.g., a CMOS device. The semiconductor device 10 comprises a substrate 12 on which an electronic circuit 14 is provided. The electronic circuit 14 may be formed at least partly on or in the substrate. For example, the electronic circuit 14 may comprise components such as diodes or transistors comprising doped regions of the substrate 16 and suitably interconnected by metal conductors on or in the substrate. In the example, the electronic circuit 14 is a micro controller unit (MCU). However, it may be any other kind of electronic circuit. The electronic circuit 14 may comprise multiple contact pads 16, e.g., two or more contact pads, for connecting the electronic circuit 14 to an external device (not shown).

A problem that may be encountered with a semiconductor device of this kind is that a spurious electrical current may temporarily be injected into the substrate 12 via the pads 16. Current injection may, for example, be caused by radio frequency perturbations in an environment of the semiconductor device 10, or by perturbations generated or transmitted by an external device connected to the electronic circuit 14 via the contact pads 16. At least part of the injected current may flow through regions of the substrate that are not part of the electronic circuit 14 and may therefore cause various undesired effects such as voltage surges and state transitions. The injected current may notably pass through isolating regions of the substrate 12, e.g., through regions intended to isolate diodes, transistors, or other components of the circuit from each other.

In one scenario, negative charge carriers, e.g., electrons, are injected via the pads 16 and accumulate at a negative well, e.g., a negatively doped region, of the substrate 12, thus temporarily lowering the electrical potential at the negative well. In another scenario, negative carriers are injected via a subset of pads, traverse the substrate and leave the substrate via another subset of pads. In both scenarios, the injected current may have undesired effects.

In order to protect sensitive parts of the electronic circuit 14 against injected currents, a guard ring 18 may be provided, as proposed, for example, in U.S. Pat. No. 5,168,340 (Nishimura). The guard ring 18 may surround the electronic circuit 14 or a sensitive region thereof, or it may extend along a major portion of a contour surrounding the sensitive region. The guard ring 18 may, however, be insufficient when the magnitude of the injected current exceeds a critical magnitude. Furthermore, it may be desirable to produce substrates which do not require a guard ring.

U.S. Pat. No. 8,315,026 B2 (Roth) proposes integrating a substrate current sensor 20 in the substrate 12, for sensing an injected substrate current. The substrate current sensor 20 may, for example, be connected to a current meter 22 for generating a signal 24 indicative of a magnitude of the substrate current. The signal 24 may be provided to the electronic circuit 14, thus enabling the electronic circuit 14 to respond to the substrate current in a suitable manner, for instance, by switching to a safe mode. The substrate current sensor 20 and the meter 22 may be part of the electronic circuit 14. Notably, the meter 22 may be arranged on or in the substrate 12 and be integrated in the electronic circuit 14, although this is not shown in the figure.

FIG. 2 schematically shows a cross section of an example of a substrate 12 as may be included in, e.g., the semiconductor device 10 shown in FIG. 1. A similar substrate has been described in greater detail in the above mentioned U.S. Pat. No. 8,315,026 B2 by Roth et al. It may comprise, for example, an injecting device 26, e.g., a PMOS field effect transistor (FET), the substrate current sensor 20, the guard ring 18, and a sensitive device 28, e.g., a PMOS FET. In a variant of the example, the guard ring 18 may be absent.

In the event of, e.g., an external perturbation, negative carriers may be injected into the substrate 12 via the injecting device 26 and be attracted by the sensitive device 28. In the example, the substrate is of a p type, and the sensitive device 28 comprises a negative well (n well) which may attract the negative carriers. A substrate current from the sensitive device 28 to the injecting device 26 through the substrate 12 may thus occur. The sensitive device 28 may thus be charged negative, which may be undesired. The substrate current may be supressed or reduced by the guard ring 18. The attraction of negative carriers by the negative well is an example of a bipolar coupling effect. In the case of an n-doped substrate (not shown), positive carriers (holes) may be attracted by a p-well.

Capacitive coupling of currents is another effect that may be observed in a semiconductor substrate. In one example, an aggressor pumps current into and out of the substrate through its capacitance to the substrate. As the resistance of the substrate is finite, this may modulate the substrate potential and a component located on or in the substrate (referred to as a victim) may then experience an exchange current through its own capacitance to the substrate. This can cause a variation of the potential into either direction on the victim's side.

An example of an embodiment of the sensor 20 and an example of a mode of operation of the sensor 20 are described in reference to FIGS. 3, 4, and 5.

As schematically illustrated in FIG. 3, the substrate current sensor 20 may be arranged to attract carriers injected into the substrate 12, e.g., negative carriers. To this end, the substrate current sensor 20 may comprise a charge collecting region 30 for attracting the carriers, e.g., a negative well 30 for attracting the negative carriers. Furthermore, the sensor 20 may comprise a current source 32 for removing carriers from the charge collecting region 30; e.g., for removing a quantity of negative carriers from the negative well 30.

As schematically illustrated in FIG. 4, the current source 32 may be connected to the negative well 30 and be arranged to produce a reference current $I_{ref}$ (also referred to herein as the threshold current) from a supply node 34 to the negative well 30, thus charging the negative well 30 and raising the potential at the negative well 30 to a sensor potential $V_{sensor}$ which may be the potential at the supply node 34. Thus, a current comparator may be formed. When the injected current $I_{injected}$ exceeds the reference current $I_{ref}$, the negative well 30 may decharge and its potential may fall accordingly. The current source is not an ideal current source. Rather, it is an implementable current source. It may sustain the reference current $I_{ref}$ only as long as the potential at the negative well is below a supply level of the current source.

A flip flop 38, e.g., a RS flip flop, may be connected, e.g., via an inverter 36, to the negative well 30 so as to detect the voltage drop at the negative well 30 that may be caused by the injected current $I_{injected}$. In the example, when the injected current is less than the reference current of the current source 32, the input of the inverter 36 is high and the set input (S input) of the flip flop 38 is low. When the injected current exceeds the reference current $I_{ref}$, the input of the inverter 36 is pulled low and the S input of the flip flop 38 is driven high, thus setting the flip flop 38. The flip flop 38 may thus indicate that the injected current $I_{injected}$ has exceeded the reference current $I_{ref}$. The Q output of the flip flop 38 may be connected, for example, to a control unit (not shown). The control unit may be arranged to set the electronic circuit 14 into an appropriate operating mode or into an appropriate state in dependence of the state of the flip flop 38. The sensor 20 as well as the control unit may be integrated in the electronic circuit 14.

SUMMARY OF THE INVENTION

The present invention provides a semiconductor device and a method of operating a semiconductor device as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale.

DETAILED DESCRIPTION OF THE PREFERRED EMBODIMENTS

Figure 5:
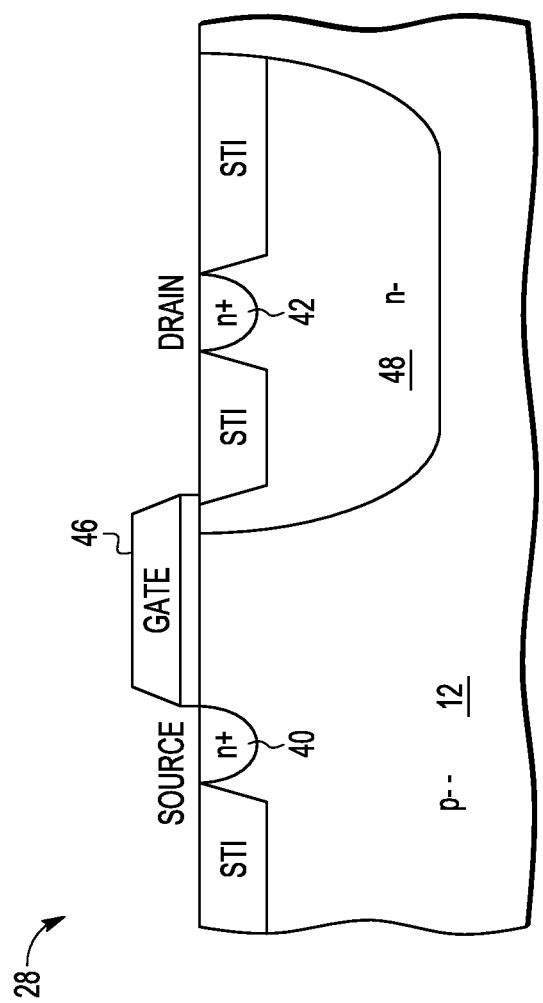
FIG. 5 schematically shows an example of an embodiment of a NMOS transistor.

FIG. 5 schematically illustrates an example in which the sensitive device 28 is an NMOS transistor with a deep negatively doped implant, e.g., a UHV NMOS transistor. Here, "deep" refers to the vertical dimension of the implant. The implant may be deep in the sense that it extends deep into the substrate. The NMOS transistor 28 comprises a source 40, a drain 42, and a gate 46. The drain 42 may comprise a deep negatively doped implant 48. The NMOS transistor may further comprise a shallow trench isolation STI. The implant 48 may render the drain 42 particularly susceptible to collecting negative carriers from the substrate 12. This may be due to the deepness of the implant 48 and to the fact that the implant is not shielded by the shallow trench isolation STI or other isolation techniques of a given semiconductor process.

Figure 6:
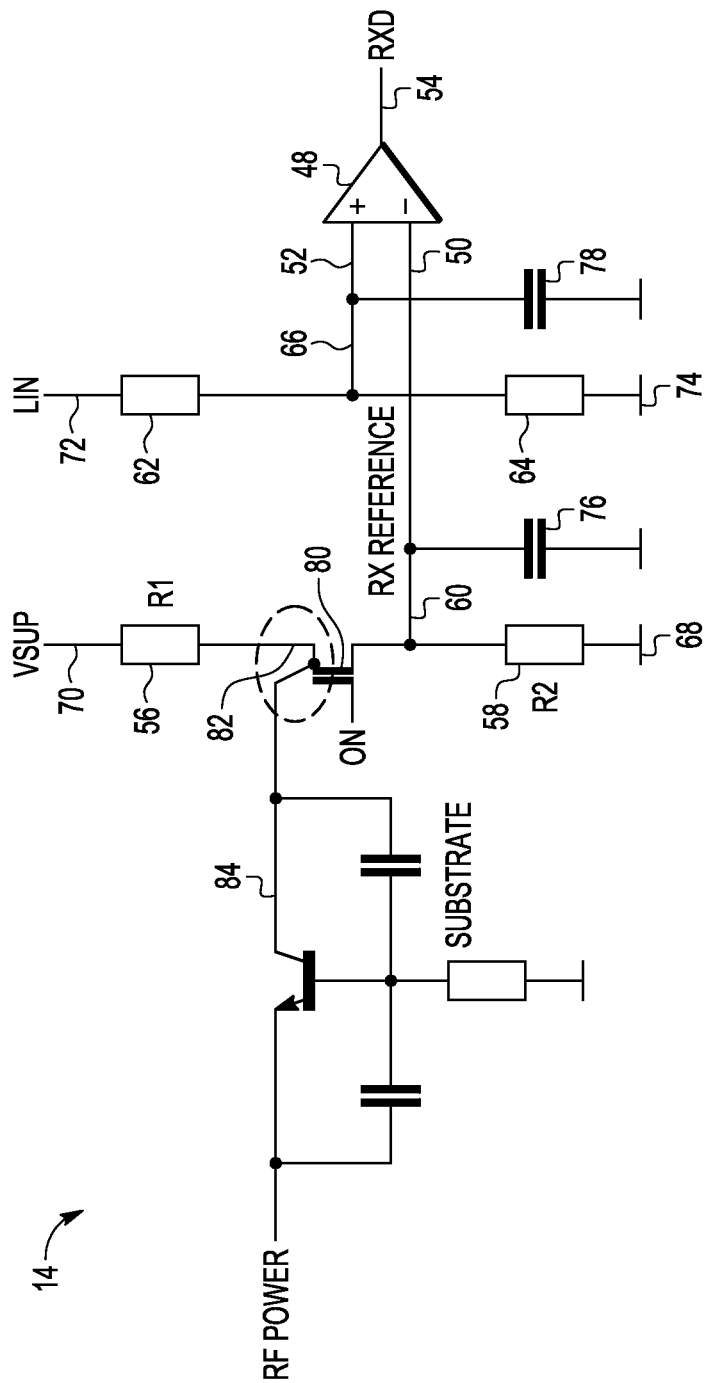
FIG. 6 schematically shows an example of an embodiment of a semiconductor device.

FIG. 6 schematically illustrates an example in which the electronic circuit 14 comprises an amplifier circuit, e.g., an amplifier circuit for processing a received LIN signal. The amplifier circuit may comprise an amplifier 48, a first voltage divider 56, 58 for providing a reference potential, and a second voltage divider 62, 64 for providing a potential representative of the received LIN signal. The first voltage provider 56, 58 may be connected between a first voltage provider node 68 and a second voltage provider node 70, for applying a direct current (DC) supply voltage across the first voltage divider 56, 58. The second voltage divider 62, 64 may be connected between, e.g., a LIN input node 72 and a reference node 74, e.g., ground.

The first voltage divider 56, 58 may comprise a first resistor 56 and a second resistor 58 connected in series and having an intermediary node 60 serving as an output node of the first voltage provider 56, 58, for providing the reference potential. The intermediary node 60 may be connected to a first input 50 of the amplifier 48. Similarly, the second voltage divider 62, 64 may have an intermediary node 66 acting as an output node of the second voltage divider 62, 64. The intermediary node 66 may be connected to a second input 52 of the amplifier 48. The amplifier 48 may be arranged to output, at its output 54, an output potential in proportion to the difference between the potentials applied at the first input 50 and the second input 52, i.e., in proportion to its input voltage.

A capacitor 76 may be connected between the first input 50 and ground. The capacitor 76 and the first voltage divider 56, 58 may form a low pass filter for filtering out unwanted higher frequency signals. The potential at the intermediary node 60 may thus fractionally follow the lower frequency trends of the supply voltage VSUP. Similarly, a capacitor 78 may be connected to the second input 52, for filtering out frequencies higher than those of the LIN data in the received LIN signal. In operation, the potential provided by the intermediary node 60 of the first voltage divider 46, 58 may be substantially stationary and serve as a reference potential against which the potential of the LIN signal, i.e., the potential provided by the intermediary node 66 of the second voltage divider 62, 64, may be compared. It may be desirable that the reference potential at the input 50 be constant, i.e., that it fluctuate as little as possible.

Figure 2:
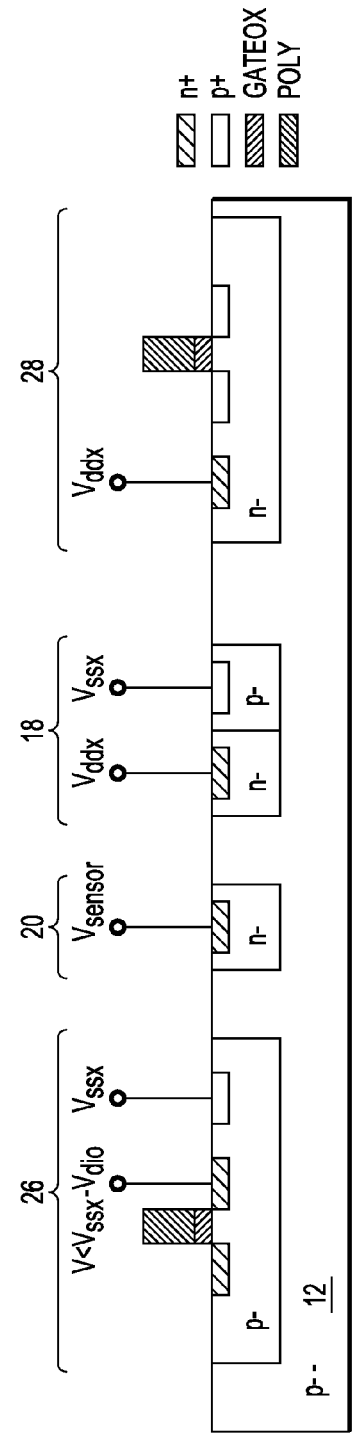
FIG. 2 schematically shows a sectional view of an example of an embodiment of a semiconductor device.
Figure 3:
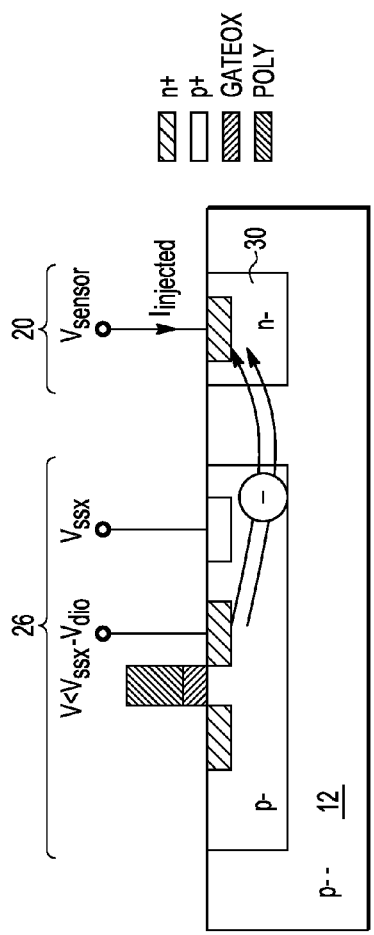
FIG. 3 schematically shows a close-up of FIG. 2.
Figure 4:
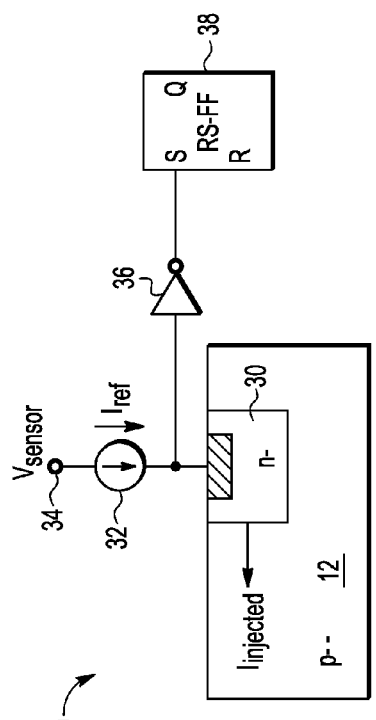
FIG. 4 schematically shows an example of an embodiment of a substrate current sensor.

In the example, a switch 80, e.g., a field effect transistor, may be connected in series with the resistors 56, 58, for enabling and disabling the first voltage divider 56, 58. In the example, turning the switch 80 off may result in decharging the first input 50 of the amplifier 48 to the first voltage provider node 68, e.g., ground, via the resistor 58. The switch 80 may be a sensitive device similar or analogous to the sensitive device in FIG. 2. More specifically, the switch 80 or a portion thereof may be susceptible to collecting carriers of an injected substrate current. This may result in an undesired raise or drop of the reference potential provided by the intermediary node 60. For instance, when the switch 80 is implemented as an NMOS field effect transistor similar to the one described in reference to FIG. 5, negative carriers from the injected current may accumulate at the drain of the NMOS transistor, resulting in a drop of the reference potential. The electrical coupling between the drain 82 of the switch 80 and the substrate 12 is represented in the figure schematically by virtual circuitry 84 connected to the drain 82.

The resistance of the resistors 56 and 58 may be fairly large in order to minimize standby power consumption. This, however, may render the reference potential provided by the intermediary node 60 very sensitive to charge fluctuations at the switch 80, as the resistors 56 and 58 may prevent charges accumulated at the switch 80 from flowing off rapidly.

Figure 7:
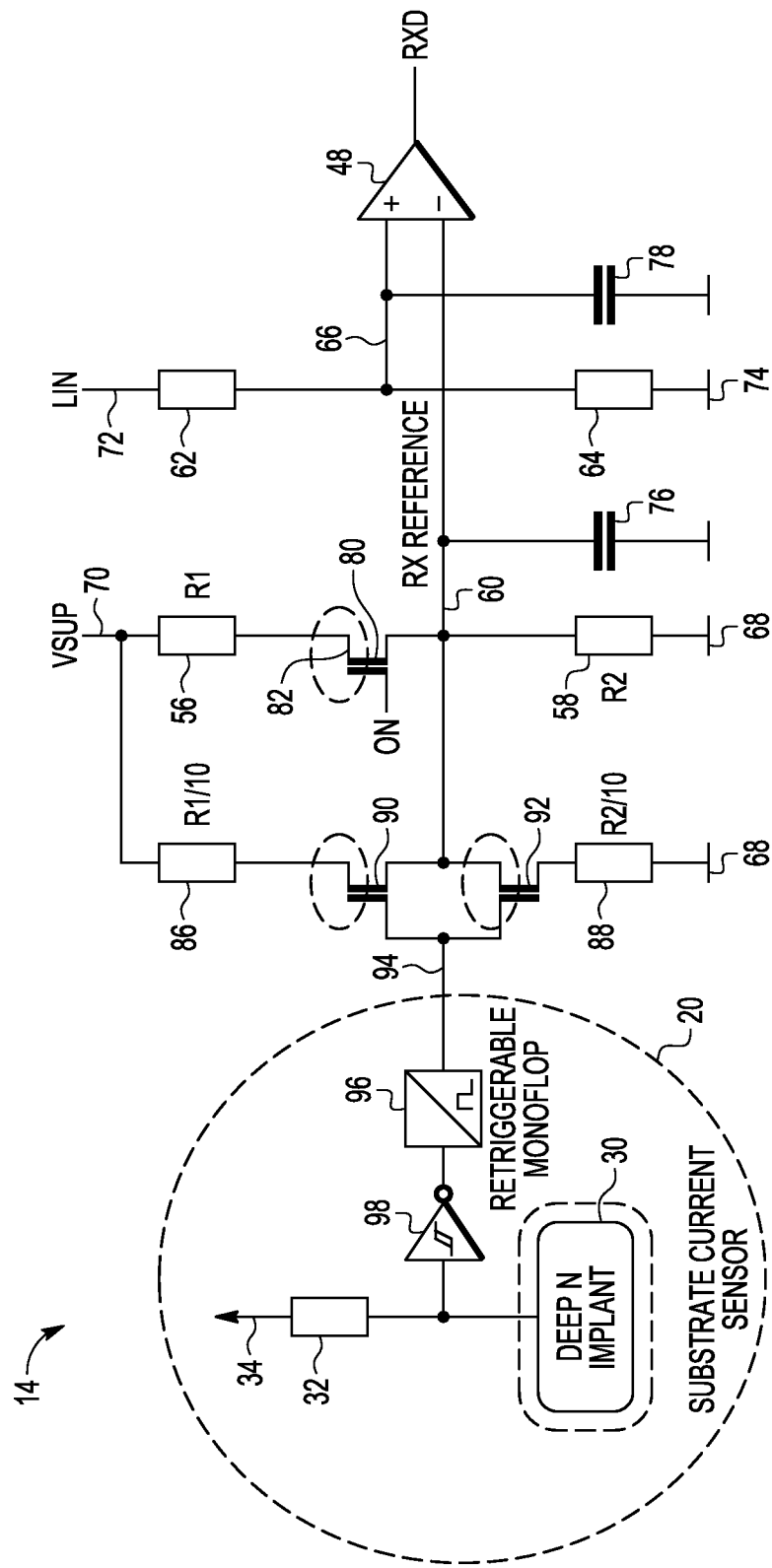
FIG. 7 schematically shows an example of an embodiment of a semiconductor device.

FIG. 7 schematically illustrates an example of a variant of the electronic circuit 14 described above in reference to FIG. 6. In this example, the amplifier circuit comprises a substrate current sensor 20 arranged to sense a substrate current. The substrate current sensor 20 may be similar, in principle, to the substrate current sensor 20 described above in reference to FIGS. 1 to 4. In the example, the substrate current sensor 20 is arranged to reduce the resistance between the intermediary node 60 and the first voltage provider node 68 and between the intermediary node 60 and the second voltage provider node 70 in response to an increase of the substrate current, e.g., in response to the substrate current exceeding a critical level. The operating current through the first voltage divider 56, 58 may thus increase, resulting in a more robust reference potential provided by the intermediary node 60.

As mentioned above, there may be at least one of two coupling effects, each affecting the sensor as well as the nodes to be protected.

One effect is bipolar coupling where foreign (victim) negative diffusions may be dragged down through parasitic npn devices (in the case of p-doped substrate materials) or parasitic pnp devices (in the case of n-doped substrate materials).

The other effect is capacitive coupling. For example, when an input toggles rapidly, with stray capacitance into the substrate, the substrate potential, due to its finite resistance, may deviate from a constant potential applied by, e.g., substrate pickups. Such victims with stray capacitance into the substrate may suffer an exchange current which can negatively influence the circuit, e.g., via the two capacitors of the parasitic circuitry 84 in FIG. 6. The exchange current, that is, a particular kind of substrate current, may have a duration that is considerably shorter than a substrate current caused by bipolar coupling. In view of this, the substrate current sensor 20 may comprise, for example, a Schmitt trigger 98 connected to the negative well 30 and a retriggerable monoflop 96 connected to the Schmitt trigger 98, as described further below.

In the example, a resistor 86 is connectable in parallel to the resistor 56, for reducing the resistance between the intermediary node 60 and the second voltage provider node 70. Similarly, a second resistor 88 is connectable in parallel to the resistor 58, for reducing the resistance between the intermediary node 60 and the first voltage provider node 68. To this end, a switch 90 may be connected in series with the resistor 86. Turning on the switch 90 may thus connect the resistor 86 in parallel to the resistor 56. Similarly, a switch 92 may be connected in series with the resistor 88. Turning on the switch 92 may thus connect the resistor 88 in parallel to the resistor 58.

The resistance of the resistor 86 and the resistance of the resistor 88 may be chosen such that the voltage divider ratio of the voltage divider formed of the resistors 56, 86, 58, 88 is the same as the voltage divider ratio of the first voltage divider 56, 58. To this end, the resistance of resistor 86 may be a times R1 wherein R1 is the resistance of resistor 56, while the resistance of the resistor 88 may be a times R2 wherein R2 is the resistance of resistor 58 and wherein a is a positive constant. The positive constant $\alpha$ may be less than 1, less than 0.3, less than 0.1, or smaller. A low resistance of the resistors 86 and 88 may ensure a large operating current between the first voltage provider node 68 and the second voltage provider node 70 and thus render the reference voltage at the intermediary node 60 less sensitive to current injected into the substrate 12.

In a variant of the example, the resistors 86 and 88 are absent, and the switches 90 and 92 are directly connected to the second voltage provider node 70 and the first voltage provider node 68, respectively. In this case, the voltage divider ratio when the switches 90 and 92 are on (i.e., conductive) may be the ratio of the resistance of switch 90 in its conductive state to the resistance of switch 92 in its conductive state. This may, however, require precise control of the resistance ratio of the switches 90 and 92.

The negatively doped well 30 of the substrate current sensor 20, i.e., the charge collecting region 30 of the substrate current sensor 20, may, for example, be arranged to surround the entire electronic circuit 14 or at least a region comprising the switch 80, or, more generally, to surround a region comprising the sensitive device. The substrate current sensor 20 may operate, in principle, as described in reference to FIG. 4. More specifically, the current source 32 may be arranged to generate a positive sensor voltage at the well 30. When negative carriers are collected by the negative well 30, the potential may drop. More specifically, the potential of the well may drop when the electrical current from the well 30 into the substrate 12 exceeds the current of the current source 32.

In the example, a retriggerable monoflop 96 is connected, e.g., via a Schmitt trigger 98, e.g., an inverting Schmitt trigger, to the well 30. The retriggerable monoflop 96 may thus output a detection signal which is normally negative and becomes positive when the injected current exceeds the reference current and which remains positive for a while even after the injected current has become less than the reference current. The detection signal may be fed to control inputs of the switches 90 and 92, for example. The switches 90 and 92 may, for example, be field effect transistors with, e.g., a common gate 94 connected to the output of the retriggerable monoflop 96.

Figure 1:
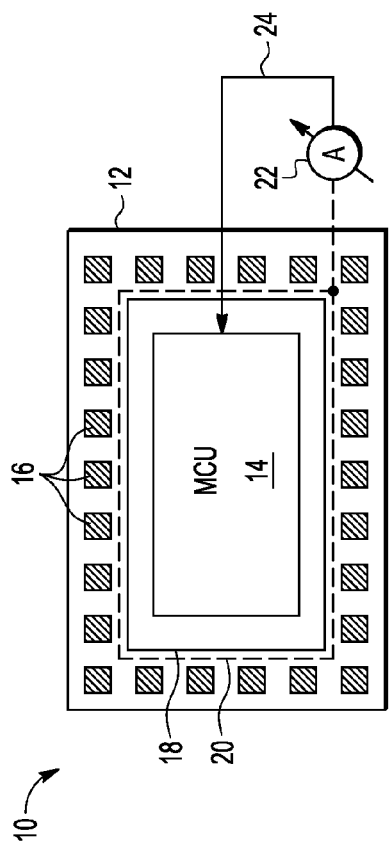
FIG. 1 schematically shows a top view of an example of an embodiment of a semiconductor device.
Figure 8:
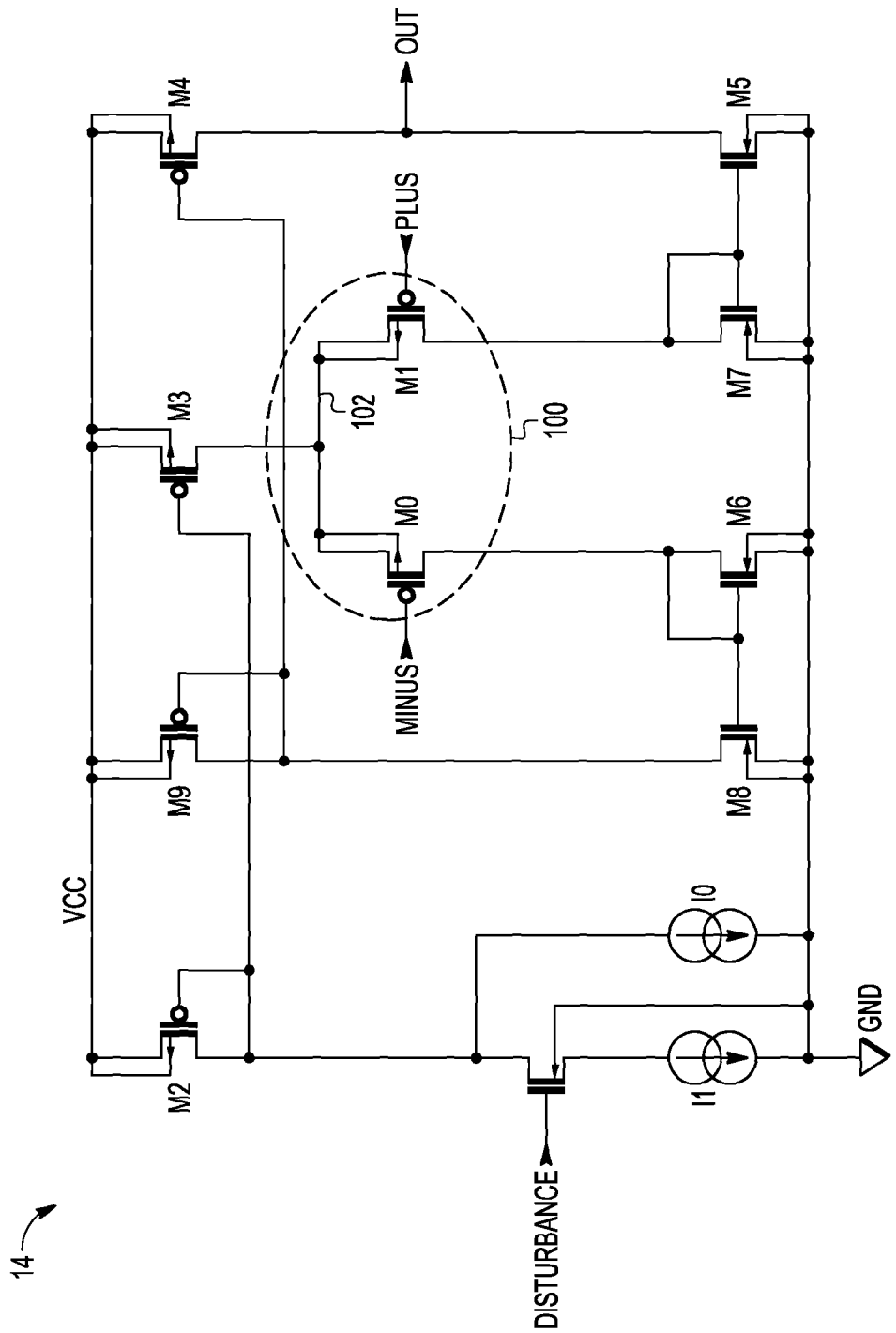
FIG. 8 schematically shows an example of an embodiment of a semiconductor device.

FIG. 8 shows a circuit diagram of another example of a circuit which may be included in the electronic circuit 14 shown in FIG. 1. The circuit in FIG. 8 may be operated as an operational amplifier having a differential input minus, plus and an output out. The circuit is connected between a first voltage provider node gnd and a second voltage provider node vcc. In operation, a first current source i0 draws a current idc of, e.g., 1 microampere from the second voltage provider node vcc, e.g., through a master transistor m2. A slave transistor m3 may have its gate connected to the drain of the master transistor m2, thus producing a constant current from the second voltage provider node vcc to the first voltage provider node gnd through transistors m0, m1, m6, m7. In the example, the resistances of the transistors m3, m0, m1, m6, and m7 can be reduced by increasing the current through the master switch m2.

In the example, comparator transistors m0 and m1 are arranged in a region 100 which may be susceptible to attracting carriers from an injected substrate current. The attracted carriers may absorb all or a major portion of the current provided by m3. Thus m0 and m1, and with them m6 and m7, may lack current and the circuit may cease to operate. For example, a current capacitively coupled into the well of m0 and m1 may occur at the output due to slight imperfections in symmetry, thus adding unwanted signals to the output.

The parasitic current from the node 102 into the substrate may be as high as the current through the transistor m3. In this case, there may be no longer any current through m0 or m1. This may cause the circuit to stall. Even in a condition in which not all of the current provided by the transistor m3 is flowing into the substrate, the circuit may deteriorate in an unacceptable fashion.

The electronic circuit 14 may further comprise a sensor (not shown in FIG. 8) similar or identical to the one described in reference to FIG. 7 and arranged to provide a detection signal to the control input of a switch m10 for connecting a second current source i1 in parallel to the first current source i0. The switch m10, e.g., an NMOS transistor, and the second current source i1 may thus be connected in parallel to the first current source i0, thus reducing the resistance of the transistors m3, m0, m1, m6, and m7. The region 100 and the circuit as a whole can thus be made more robust against injected substrate currents.

The second current source i1 may be arranged to produce an electrical current which is substantially greater than the current produced by the first current source i0. For instance, the current i1 may be more than 3, 10, 30, or 100 times greater than the current i0. It is noted that the network comprising the first current source i0, the second current source i1 and the switch m10 may be equivalent to a single controllable current source.

Figure 9:
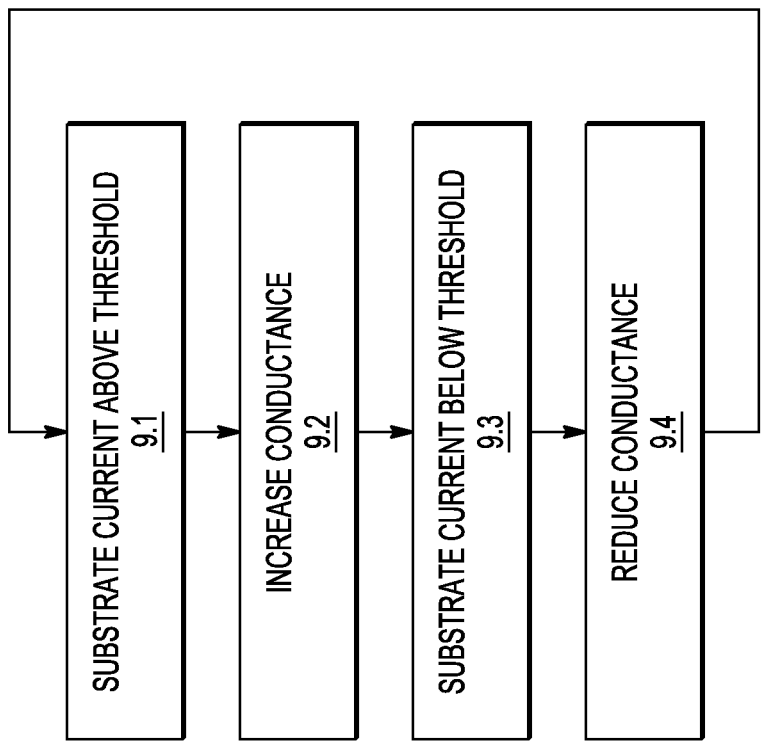
FIG. 9 shows a flow chart of an example of an embodiment of a method of operating a semiconductor device.

Turning now to FIG. 9, an example of a method of operating a semiconductor device is described. The semiconductor device comprises a substrate and an electronic circuit formed at least partly on or in the substrate. The electronic circuit comprises a first voltage provider node, a second voltage provider node, and an intermediary node connected to the first voltage provider node by a first network having a first resistance and to the second voltage provider node by a second network having a second resistance. The resistance between the intermediary node and the first voltage provider node is the first resistance and the resistance between the intermediary node and the second voltage provider node is the second resistance. The substrate is susceptible to conducting a substrate current which is a spurious electrical current. The semiconductor device further comprises a substrate current sensor connected to the substrate. The substrate current sensor senses the substrate current. The first network reduces the first resistance (box 9.2) in response to the substrate current sensor signaling an increase of the substrate current (box 9.1) and increases the first resistance (box 9.4) in response to the substrate current sensor signaling a decrease of the substrate (box 9.3). Similarly, the second network reduces the second resistance (box 9.2) in response to the substrate current sensor signaling an increase of the substrate current (box 9.1) and increases the second resistance (box 9.4) in response to the substrate current sensor signaling a decrease of the substrate current (box 9.3). The first resistance and the second resistance may be varied, that is, reduced (box 9.2) or increased (box 9.4), simultaneously and at the same rate to ensure that the ratio of the first resistance to the second resistance remains constant.

In one example, the operation of increasing the first and the second resistance (box 9.4) is performed only when the detected substrate current has remained below a certain threshold for a minimum period. This minimum period may be viewed as a safety period. During the safety period, the first resistance and the second resistance remain low although the substrate current has fallen below the threshold. The safety period can be advantageous because any current injection event may be followed by a period during which the probability for another current injection event is above average. This is due to the fact that spurious current transients in the substrate may occur in bursts, e.g., as a result of spurious capacitive couplings in the substrate. Providing the safety period may render the electronic circuit connected to the substrate current sensor more robust against such bursts. The safety period may be implemented, for example, using a Schmitt trigger in series with a retriggerable monoflop, e.g., as described above in reference to FIG. 7.

To recapitulate, FIGS. 7 and 8 illustrate two examples of a semiconductor device 10. The semiconductor device 10 comprises a substrate 12 and an electronic circuit 14 formed at least partly on or in the substrate 12.

The electronic circuit 14 comprises a first voltage provider node 68/gnd, a second voltage provider node 70/vcc, and an intermediary node 60/102 connected to the first voltage provider node 68/gnd by a first network 58, 88, 92/m0, m1, m6, m7 having a first resistance and to the second voltage provider node 70/vcc by a second network 56, 86, 90/m3 having a second resistance. The first resistance is the resistance between the intermediary node 60 and the first voltage provider node 68/gnd. The second resistance is the resistance between the intermediary node 60 and the second voltage provider node 70/vcc. The intermediary node 60 may, for example, be arranged to provide a bias voltage or a reference voltage.

The substrate 12 may be susceptible to conducting a substrate current which is a variable spurious electrical current. Semiconductor device 10 therefore comprises a substrate current sensor 20 connected to the substrate 12 and arranged to sense the substrate current.

The first network 58, 88, 92/m0, m1, m6, m7 may be arranged to reduce the first resistance in response to the substrate current sensor 20 signaling an increase of the substrate current and to increase the first resistance in response to the substrate current sensor 20 signaling a decrease of the substrate 12. Similarly, the second network 56, 86, 90/m3 may be arranged to reduce the second resistance in response to the substrate current sensor 20 signaling an increase of the substrate current and to increase the second resistance in response to the substrate current sensor 20 signaling a decrease of the substrate 12. Reducing the first and the second resistance may render the potential at the intermediary node less sensitive to the substrate current and thus make the electronic circuit 14 more robust, at the expense of a higher power consumption.

In one example, it may be ensured, however, that the reduced values of the first and the second resistance are still sufficiently large to avoid a short between the first voltage provider node and the second voltage provider node. In other words, reducing the first and the second resistance may include ensuring that they are not reduced below a certain positive minimum level. Excessive generation of heat and excessive power losses may thus be avoided. For example, the first and the second resistance may be controlled or arranged to become not smaller than, e.g., 1% or 0.1% of their normal values. Their normal values are their values when no substrate current is detected.

In another example, there is no lower bound for the first resistance and the second resistance. In this case, a short between the first and second voltage provider nodes may occur. This may be acceptable if it is ensured that such short will exist only for a brief period.

Increasing the first resistance and the second resistance in response to a decrease of the substrate current may return the power consumption to a lower level. The ratio of the first resistance to the second resistance may be conserved in said operations of increasing and reducing the first and the second resistance, thus ensuring that the potential at the intermediary node remains constant.

In the example of FIG. 7, which has been described in greater detail above, the first network 58, 88, 92 may comprise a switch 92 connected between the first voltage provider node 68 and the intermediary node 60 while the second network 56, 86, 90 may comprise a switch 90 connected between the intermediary node 60 and the second voltage provider node 70. The switch 92 of the first network 58, 88, 92 and the switch 90 of the second network 56, 86, 90 may each be arranged to become more conductive in response to the substrate current sensor 20 signaling an increase of the substrate current and to become less conductive in response to the substrate current sensor 20 signaling a decrease of the substrate current, thereby adapting the first and the second resistance in dependence of the substrate current. The switch 92 of the first network 58, 88, 92 and the switch 90 of the second network 56, 86, 90 each have a control input connected to the substrate current sensor 20.

For example, the first network 58, 88, 92 and the second network 56, 86, 90 may each comprise a first path and a second path connected in parallel. The respective first path may comprise the switch 92 and the switch 90, respectively. The respective second path may comprise a resistor 88 and 90, respectively.

In the example of FIG. 8, which has been described in greater detail above, the electronic circuit 14 comprises a current source for producing a control current. The resistance of the first network m0, m1, m6, m7 and the resistance of the second network m3 may depend on the control current. The current source may be arranged to increase the control current in response to the substrate current sensor 20 signaling an increase of the substrate current and to reduce the control current in response to the substrate current sensor 20 signaling a decrease of the substrate current.

The current source may, for example, comprise a first current source 10 and a boost line connected in parallel to the first current source. The boost line may comprise a second current source 11 and a switch m10 connected in series with the second current source. The switch may be arranged to turn on in response to the substrate current sensor 20 signaling an increase of the substrate current and to turn off in response to the substrate current sensor 20 signaling a decrease of the substrate current.

In both of the examples of FIGS. 7 and 8, the substrate current sensor 20 may be arranged to define a non-zero threshold current, and the substrate current sensor 20 may be arranged to detect whether the substrate current exceeds the threshold current and to signal said increase of the substrate current only when the substrate current exceeds the threshold current. Similarly, the substrate current sensor 20 may be arranged to signal said decrease of the substrate current only when the substrate current has dropped below the threshold current.

The substrate current sensor 20 may comprise a charge collecting region 30 which is a doped region of the substrate 12. The charge collecting region 30 may surround a region comprising the intermediary node 60. The substrate 12 may be of a p type and the charge collecting region 30 of an n type, or vice versa. The substrate current sensor 20 may, for example, comprise a current source 32 connected to the charge collecting region 30 and arranged to inject a threshold current Iref into the charge collecting region 30, and a voltage sensor 98, 96 connected to the charge collecting region 30 and arranged to produce a detection signal in dependence of a voltage at the charge collecting region 30.

The voltage sensor 98, 96 may, for example, comprise a Schmitt trigger 98 and a retriggerable monoflop 96. The Schmitt trigger 98 may have an input connected to the charge collecting region 30 and an output connected to an input of the retriggerable monoflop 96. Any short substrate current transient may thus trigger a safety period during which the detection output signal of the substrate current sensor 20 remains high.

In the foregoing specification, the invention has been described with reference to specific examples of embodiments of the invention. It will, however, be evident that various modifications and changes may be made therein without departing from the broader spirit and scope of the invention as set forth in the appended claims.

For example, the connections may be an type of connection suitable to transfer signals from or to the respective nodes, units or devices, for example, via intermediate devices. Accordingly, unless implied or stated otherwise the connections may, for example, be direct connections or indirect connections.

The semiconductor substrate described herein can be any semiconductor material or combinations of materials, such as gallium arsenide, silicon germanium, silicon, monocrystalline silicon, the like, and combinations of the above, possibly with the exception of silicon-on-insulator (SOI). In fact, the above described effects that may generate a spurious substrate current may be absent or less pronounced in SOI materials.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterisk (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or an limits any particular claim containing such introduced claim element to inventions containing only one such element, even when the same claim includes the introductory phrases one or more or at least one and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

The invention claimed is:

1. A semiconductor device, comprising a substrate and an electronic circuit formed at least partly on or in the substrate; wherein
   the electronic circuit comprises a first voltage provider node, a second voltage provider node, and an intermediary node, wherein the intermediary node is connected to the first voltage provider node by a first network having a first resistance and to the second voltage provider node by a second network having a second resistance, the resistance between the intermediary node and the first voltage provider node being the first resistance and the resistance between the intermediary node and the second voltage provider node being the second resistance;
   the substrate is susceptible to conducting a substrate current, which is a variable spurious electrical current and the semiconductor device further comprises a substrate current sensor connected to the substrate and arranged to sense the substrate current;
   the first network is arranged to reduce the first resistance in response to the substrate current sensor signaling an increase of the substrate current and to increase the first resistance in response to the substrate current sensor signaling a decrease of the substrate; and
   the second network is arranged to reduce the second resistance in response to the substrate current sensor signaling an increase of the substrate current and to increase the second resistance in response to the substrate current sensor signaling a decrease of the substrate.

2. The semiconductor device of claim 1, wherein the intermediary node is arranged to provide a bias voltage or a reference voltage.

3. The semiconductor device of claim 2, wherein the ratio of the first resistance to the second resistance is conserved in said operations of reducing and increasing the first and second resistance.

4. The semiconductor device of claim 1, wherein the ratio of the first resistance to the second resistance is conserved in said operations of reducing and increasing the first and second resistance.

5. The semiconductor device of claim 1, wherein the first network comprises a switch connected between the first voltage provider node and the intermediary node and wherein the second network comprises a switch connected between the intermediary node and the second voltage provider node, wherein the switch of the first network and the switch of the second network are each arranged to become more conductive in response to the substrate current sensor signaling an increase of the substrate current and to become less conductive in response to the substrate current sensor signaling a decrease of the substrate current.

6. The semiconductor device of claim 5, wherein the first network and the second network each comprise a first path and a second path connected in parallel, the first path comprising the switch of the first or second network, the second path comprising a resistor.

7. The semiconductor device of claim 5, wherein the switch of the first network and the switch of the second network each have a control input connected to the substrate current sensor.

8. The semiconductor device of claim 1, wherein the electronic circuit comprises a current source for producing a control current, wherein the resistance of the first network and the resistance of the second network depend on the control current, and wherein the current source is arranged to increase the control current in response to the substrate current sensor signaling an increase of the substrate current and to reduce the control current in response to the substrate current sensor signaling a decrease of the substrate current.

9. The semiconductor device of claim 8, wherein the current source comprises a first current source and a boost line connected in parallel to the first current source, the boost line comprising a second current source and a switch connected in series with the second current source, wherein the switch is arranged to turn on in response to the substrate current sensor signaling an increase of the substrate current and to turn off in response to the substrate current sensor signaling a decrease of the substrate current.

10. The semiconductor device of claim 1, wherein the substrate current sensor is arranged to define a non-zero threshold current, and wherein said increase of the substrate current includes the substrate current exceeding the threshold current and said decrease of the substrate current includes the substrate current dropping below the threshold current.

11. The semiconductor device of claim 1, wherein the substrate current sensor comprises a charge collecting region which is a doped region of the substrate.

12. The semiconductor device of claim 11, wherein the charge collecting region surrounds a region comprising the intermediary node.

13. The semiconductor device of claim 11, where the substrate is of a p type and the charge collecting region is of an n type, or vice versa.

14. The semiconductor device of claim 11, wherein the substrate current sensor comprises:
   a current source connected to the charge collecting region and arranged to inject a threshold current into the charge collecting region, and
   a voltage sensor connected to the charge collecting region and arranged to produce a detection signal in dependence of a voltage at the charge collecting region.

15. The semiconductor device of claim 14, wherein the voltage sensor comprises a Schmitt trigger and a retriggerable monoflop, the Schmitt trigger having an input connected to the charge collecting region and an output connected to an input of the retriggerable monoflop.

16. A method of operating a semiconductor device, wherein the semiconductor device comprises a substrate and an electronic circuit formed at least partly on or in the substrate;
- the electronic circuit comprises a first voltage provider node, a second voltage provider node, and an intermediary node, wherein the intermediary node connected to the first voltage provider node by a first network having a first resistance and to the second voltage provider node by a second network having a second resistance, the resistance between the intermediary node and the first voltage provider node being the first resistance and the resistance between the intermediary node and the second voltage provider node being the second resistance;
- the substrate is susceptible to conducting a substrate current which is a variable spurious electrical current and the semiconductor device further comprises a substrate current sensor connected to the substrate and which senses the substrate current;
- wherein the method comprises:
    - in response to the substrate current sensor signaling an increase of the substrate current, reducing both the first resistance and the second resistance; and
    - in response to the substrate current sensor signaling a decrease of the substrate, increasing both the first resistance and the second resistance.

* * * * *